United States Patent
Mos et al.

(10) Patent No.: US 11,480,884 B2
(45) Date of Patent: *Oct. 25, 2022

(54) METHOD FOR OPTIMIZATION OF A LITHOGRAPHIC PROCESS

(71) Applicant: ASML NETHERLANDS B.V., Veldhoven (NL)

(72) Inventors: Everhardus Cornelis Mos, Best (NL); Jochem Sebastiaan Wildenberg, Aarle-Rixtel (NL); Erik Johannes Maria Wallerbos, Helmond (NL); Maurits Van Der Schaar, Eindhoven (NL); Frank Staals, Eindhoven (NL); Franciscus Hendricus Arnoldus Elich, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 63 days.

This patent is subject to a terminal disclaimer.

(21) Appl. No.: 16/936,867

(22) Filed: Jul. 23, 2020

(65) Prior Publication Data
US 2020/0356012 A1    Nov. 12, 2020

Related U.S. Application Data

(63) Continuation of application No. 16/431,168, filed as application No. PCT/EP2017/076338 on Oct. 16, 2017, now Pat. No. 10,802,408.

(30) Foreign Application Priority Data

Oct. 26, 2016 (EP) .................................... 16195819
Dec. 22, 2016 (EP) .................................... 16206235
Aug. 7, 2017 (EP) .................................... 17185056

(51) Int. Cl.
*G03F 7/20* (2006.01)

(52) U.S. Cl.
CPC .......... *G03F 7/70525* (2013.01); *G03F 7/705* (2013.01); *G03F 7/70508* (2013.01);
(Continued)

(58) Field of Classification Search
None
See application file for complete search history.

(56) References Cited

U.S. PATENT DOCUMENTS 7,474,001 B2    1/2009  Zhao et al.
7,646,906 B2    1/2010  Saidin et al.
(Continued)

FOREIGN PATENT DOCUMENTS

| | | |
|---|---|---|
| JP | 2007027718 | 2/2007 |
| KR | 20110095832 | 8/2011 |
| KR | 20120104636 | 9/2012 |

OTHER PUBLICATIONS

International Search Report and Written Opinion issued in corresponding PCT Patent Application No. PCT/EP2017/076338, dated Jan. 9, 2018.

(Continued)

*Primary Examiner* — Michelle M Iacoletti
(74) *Attorney, Agent, or Firm* — Pillsbury Winthrop Shaw Pittman LLP (57) ABSTRACT

A method for improving the yield of a lithographic process, the method including: determining a parameter fingerprint of a performance parameter across a substrate, the parameter fingerprint including information relating to uncertainty in the performance parameter; determining a process window fingerprint of the performance parameter across the substrate, the process window being associated with an allowable range of the performance parameter; and determining a probability metric associated with the probability of the performance parameter being outside an allowable range.

(Continued)

Optionally a correction to the lithographic process is determined based on the probability metric.

20 Claims, 5 Drawing Sheets

(52) U.S. Cl.
CPC ...... *G03F 7/70616* (2013.01); *G03F 7/70625* (2013.01); *G03F 7/70633* (2013.01); *G03F 7/70641* (2013.01)

(56) References Cited

U.S. PATENT DOCUMENTS

| | | | |
|---|---|---|---|
| 7,941,768 B1 | 5/2011 | Wei | |
| 8,102,408 B2 | 1/2012 | Verma et al. | |
| 8,856,698 B1 | 10/2014 | Latypov | |
| 9,360,766 B2 | 6/2016 | Ye et al. | |
| 10,802,408 B2 * | 10/2020 | Mos | G03F 7/70616 |
| 2003/0219658 A1 | 11/2003 | Shishido et al. | |
| 2007/0009814 A1 | 1/2007 | Oesterholt | |
| 2007/0050749 A1 | 3/2007 | Ye et al. | |
| 2008/0294280 A1 | 11/2008 | Okita | |
| 2011/0205511 A1 | 8/2011 | Padiy et al. | |
| 2011/0216293 A1 | 9/2011 | Padiy et al. | |
| 2012/0008127 A1 | 1/2012 | Tel et al. | |
| 2014/0089870 A1 | 3/2014 | Mos et al. | |
| 2014/0282307 A1 | 9/2014 | Latypov | |
| 2015/0185626 A1 | 7/2015 | Chen et al. | |
| 2018/0259858 A1 | 9/2018 | Chen et al. | |

OTHER PUBLICATIONS

Taiwanese Office Action issued in corresponding Taiwanese Patent Application No. 106136441, dated Jul. 12, 2018.
Zhou, Wenzhan et al.: "Lithography process window analysis with calibrated model", Proc. of SPIE, vol. 5375, May 24, 2004.
Korean Notice of Allowance issued in corresponding Korean Patent Application No. 10-2021-7006316, dated Oct. 27, 2021.

* cited by examiner

METHOD FOR OPTIMIZATION OF A LITHOGRAPHIC PROCESS

This application is a continuation of U.S. patent application Ser. No. 16/343,168, filed on Apr. 18, 2019, which is the U.S. national phase entry of PCT patent application no. PCT/EP2017/076338, which was filed on Oct. 16, 2017, which claims the benefit of priority of European patent application no. 16195819.4, which was filed on Oct. 26, 2016, European patent application no. 16206235.0, which was filed on Dec. 22, 2016, and European patent application no. 17185056.3, which was filed on Aug. 7, 2017, each of which is incorporated herein in its entirety by reference.

FIELD

The present description relates to device manufacturing and in particular to a method for improving the yield of a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g. for process control and verification. Various tools for making such measurements are known, including: scanning electron microscopes, which are often used to measure critical dimension (CD); specialized tools to measure overlay, the accuracy of alignment of two layers in a device; and scatterometers which can measure various properties of patterned substrates.

SUMMARY

Having measured a property, such as overlay, across a substrate, known process optimization techniques adjust a related imaging parameter for subsequent exposures of the substrate or other substrates so as to optimize the root mean square error of that property across the substrate. However, this approach is not always optimum.

An embodiment of the present invention aims to, for example, improve yield in a lithographic device manufacturing process.

In an aspect, there is provided a method for improving the yield of a lithographic process, the method comprising:
  determining a parameter fingerprint of a performance parameter across a substrate, the parameter fingerprint including information relating to uncertainty in the performance parameter;
  determining a process window fingerprint of the performance parameter across the substrate, the process window being associated with an allowable range of the performance parameter; and
  determining a probability metric associated with the probability of the performance parameter being outside an allowable range, using the parameter fingerprint and the process window fingerprint.

In an aspect, there is provided a method for improving the yield of a lithographic process, the method comprising:
  determining an uncertainty fingerprint of a performance parameter across a substrate;
  determining a process window fingerprint of the performance parameter across the substrate, the process window being associated with an allowable range of the performance parameter;
  determining a probability metric associated with the probability of the performance parameter being outside an allowable range; and
  determining a position of a metrology target on the substrate based on the probability metric.

In an aspect, there is provided a method for improving the yield of a lithographic process, the method comprising:
  determining an uncertainty fingerprint of a performance parameter across a substrate;
  determining a process window fingerprint of the performance parameter across the substrate, the process window being associated with an allowable range of the performance parameter;
  determining a probability metric associated with the probability of the performance parameter being outside an allowable range; and
  determining a measurement position of a metrology target on the substrate based on the probability metric.

In an aspect, there is provided a method for improving the yield of a lithographic process, the method comprising:
  obtaining performance parameter data associated with at least a part of a substrate, wherein the performance parameter data is utilized to control the lithographic process;
  determining a process window fingerprint of the performance parameter across the at least part of the substrate, the process window being associated with an allowable range of the performance parameter; and
  modifying the performance parameter data based on a predicted effect of the modifying on the yield of the lithographic process.

In an aspect, there is provided a device manufacturing method comprising performing the method described above to improve the yield of a lithographic process and performing the lithographic process to manufacture devices.

In an aspect, there is provided a computer program comprising computer-readable instructions that, when executed by a computer system, cause the computer system to perform a method for improving the yield of a lithographic process as described above.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
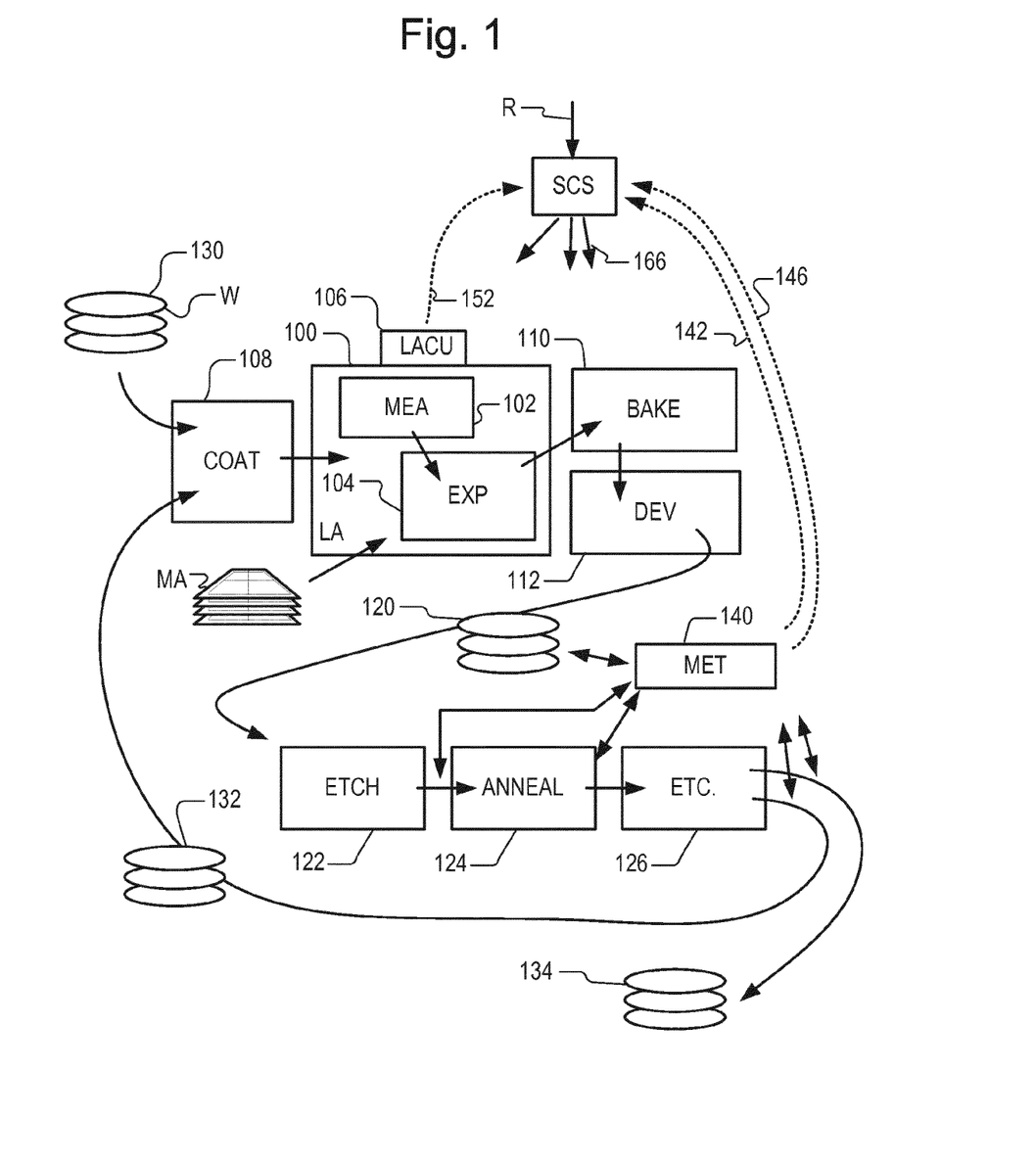
FIG. 1 depicts a lithographic apparatus together with other apparatuses forming a production facility for semiconductor devices.

FIG. 1 illustrates a typical layout of a semiconductor production facility in which an embodiment of the present invention may be put into effect. A lithographic apparatus 100 applies a desired pattern onto a substrate. A lithographic apparatus is used, for example, in the manufacture of integrated circuits (ICs). In that instance, a patterning device, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate W° (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other). One field may be further divided into "dies", a die typically being defined as an area on a reticle or substrate associated with a fully functional integrated circuit layer. Often a reticle comprises circuits of patterns for multiple integrated circuits, a field does then include multiple dies.

A requirement on the lithographic apparatus is an accurate reproduction of the desired pattern onto the substrate. The positions and dimensions of the applied product features need to be within certain tolerances. Position errors may occur due to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors.

An error in a critical dimension (CD) of the product feature may occur when the applied dose associated with the exposure 104 is not within specification. For this reason, the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal position errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and further processing apparatuses, 126, etc. . . . . The metrology apparatus is configured to inspect substrates after development (112) or after further processing (e.g. etching). The various apparatus within the litho cell are controlled by a supervisory control system SCS, which controls the lithographic apparatus via lithographic apparatus control unit LACU. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as advanced process control (APC) described for example in U.S. Patent Application Publication No. US 2012-008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example context data relating to CD errors on a reticle may be used to control various apparatus (lithographic apparatus, etching station) such that the CD errors will not affect the yield of the manufacturing process. Subsequent metrology data may then be used to verify the effectiveness of the control strategy and corrective actions may be determined.

The use of metrology results is instrumental for the performance of a lithographic process. At the same time, the requirements on the relevance of the metrology data are increasing with every shrink (reduction in size of the features manufactured) of the lithographic process. Relevance of the metrology data is only guaranteed when the used metrology targets are representative of the behavior of the product features. This problem is addressed during the design of the metrology target. To mimic the behavior of product features the metrology target may incorporate segmented features, assist features, or features with a particular geometry and/or dimension. A carefully designed metrology target responds to process variations in a similar fashion as the product features would do (on average). This allows accurate process control.

The metrology targets further need to be optimally distributed across the substrate and/or reticle. As any unnecessary measurement may affect the throughput of the lithographic process negatively, absence of metrology targets within critical areas may affect the yield of the lithographic process negatively. The technical field related to optimally position and/or optimally measure metrology targets is often referred to as "scheme optimization". A carefully selected metrology scheme is important to optimally control the lithographic process without performing an excessive amount of measurements or sacrificing valuable space on the substrate or reticle to incorporate redundant metrology targets.

Currently control of a lithographic apparatus is to a large extent based on metrology data associated with measurements on targets representative of product features. Metrology data is processed (modeled, interpolated, extrapolated) in order to provide information regarding behavior of a performance parameter (focus, dose, CD, overlay) across the entire substrate, preferably on a dense grid layout. The lithographic apparatus control infrastructure ensures that the processed metrology data is converted to required corrections, which need to be applied during subsequent exposure of the substrate(s).

The required corrections may be implemented by one or more devices arranging one or more of: adjusting the projection lens of the lithographic tool, adjusting dose settings of the lithographic tool, adjusting substrate table control parameters, adjusting the reticle. In general the effectiveness of the corrections is verified by measurements on metrology targets (created during the exposure of the substrate). In this fashion the performance parameter is measured, optimized and verified based on its behavior across the entire substrate. This flow of measurement, optimization (based on correction mechanisms) and verification is an important control strategy adopted for advanced semiconductor manufacturing processes.

As a first adaptation to the "entire substrate" control concept one may ignore the values of the performance parameter associated with dies which are not fully exposed (those dies will never become part of an end-product). This leaves more correction potential to be used to get the fully exposed dies within specification.

As a second adaptation the control strategy may include weighting of performance parameter values with a number representative of the size of a process window at the particular locations on the substrate. The process window is the range of the performance parameter (focus, overlay, CD, dose) for which the lithographic process is performed within specification. For example focus control may be targeted specifically to parts of the die which are known to be susceptible to focus variations, e.g. which have a small process window (in this case with respect to a focus parameter). Less critical parts of the die will then receive sub-optimal focus control, but this will not impact the quality of the product significantly as the less critical parts have a larger process window and accordingly are more tolerant to sub-optimal focus control.

As a third strategy the performance parameter may be controlled based (partially) on an expected dies-in-spec criterion. For example, the focus control strategy across a wafer is tailored to optimize the number of dies for which the performance parameter meets a certain criterion; for example, the CD variation must remain below 8% of a nominal value of the CD.

For all proposed control strategies it is desirable to have a reliable performance parameter data set on which the control of the lithographic apparatus is based. In practice metrology data availability is limited and sample schemes need to be optimal to provide a sufficiently accurate estimation of a performance parameter distribution (fingerprint) across the substrate. Utilized models to extrapolate and interpolate metrology data need to be realistic and suitable for the metrology data processing. In any case modeling performance parameter data provides the opportunity to assign to a certain location on a substrate an estimate of the uncertainty of the associated performance parameter value. If the model is just an average value of the metrology data (model assumes the performance parameter is constant across the substrate), the uncertainty would be simply the standard deviation of the performance parameter values (as measured across the substrate). In general this applies also to more complex models (polynomial, radial base functions); the uncertainty being the standard deviation of the difference between a measured performance parameter value and an expected performance parameter value (based on a model assumption).

The measure of uncertainty of a performance parameter at a certain location on a substrate may be valuable input for a control strategy. A high uncertainty indicates that the performance parameter may substantially deviate from a desired value. Hence control of the lithographic apparatus may need to be targeted to either a) bring the performance parameter towards a target value or b) accept that high uncertainty areas have a high risk of performance not being within specification and focus control on the areas on the substrate demonstrating a lower uncertainty (e.g. being better controllable). Strategy b) is a variant of the "dies-in-spec" control strategy where most control effort is directed towards a maximum yield of dies which will meet performance specifications. Basically parts of the substrates for which the uncertainty of the performance parameter is high are sacrificed for the benefit of improving the performance parameter associated with areas on the substrate for which the uncertainty of the performance parameter is lower.

The uncertainty metric may be combined with knowledge of how critical the performance parameter control is for features on the substrate. The latter basically expressing a size of the process window across the substrate.

Figure 2A:
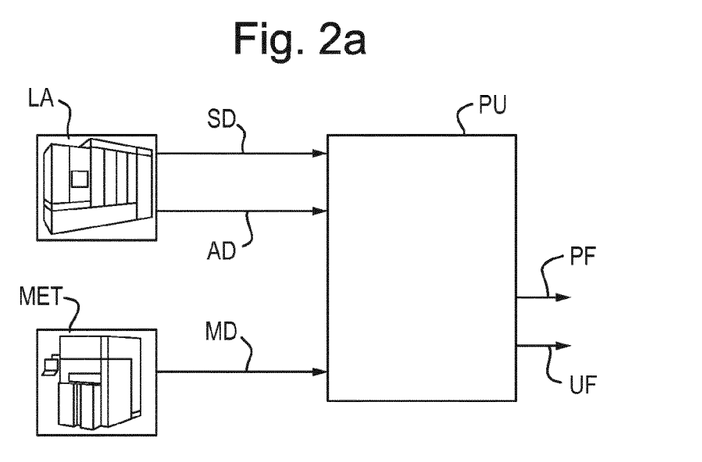
FIG. 2A depicts a process of estimation of a performance parameter fingerprint.
Figure 2B:
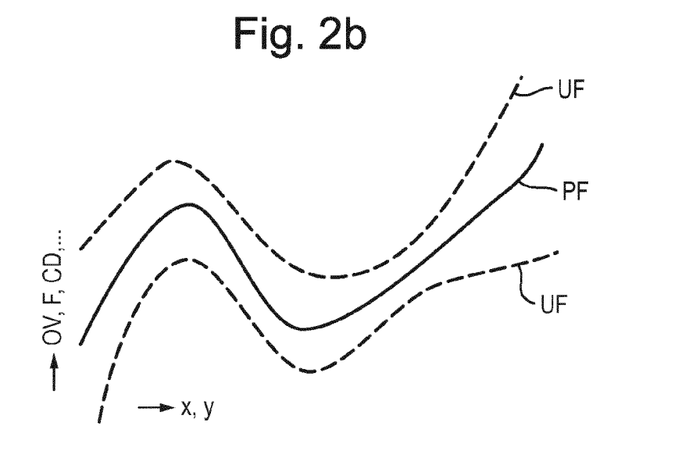
FIG. 2B depicts a performance parameter fingerprint and an uncertainty fingerprint.

A practical implementation of the proposed concept is illustrated by FIGS. 2, 3, 4 and 5. FIG. 2 shows how metrology data MD measured by metrology apparatus MET and data measured by the lithographic apparatus LA (e.g.

sensor data SD and/or actuator data AD) are combined in processor unit PU to estimate a fingerprint PF of a performance parameter like CD, overlay or focus. The fingerprint can be estimated across the wafer, hence including variations between fields (=inter-field) or across a field (within the field=intra-field). The fingerprint is estimated and an associated uncertainty fingerprint UF of the performance parameter is derived. The fingerprint of the performance parameter and its uncertainty can be considered as a combined parameter fingerprint. Note that (x,y) denotes a general dependency on the location in the field and on the wafer. The uncertainty fingerprint UF (FIG. 2b) comprises contributions of measurement noise (limited measurement accuracy) and contributions caused by a limited accuracy of the interpolation and extrapolation methods used to estimate performance parameter values.

Figure 3A:
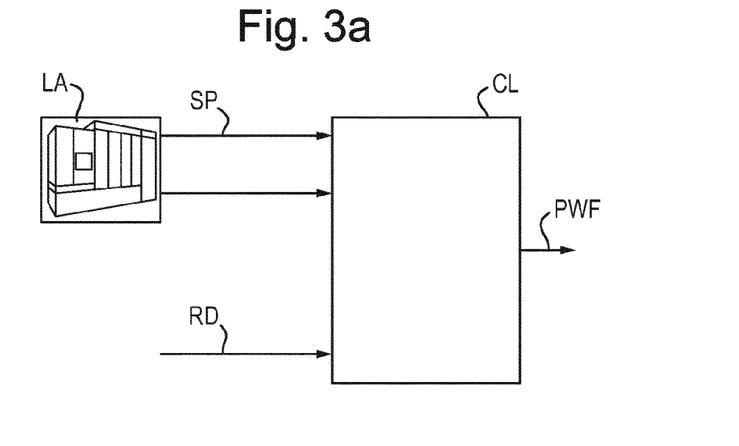
FIGS. 3A and 3B depict a process of computing a process window.
Figure 3B:
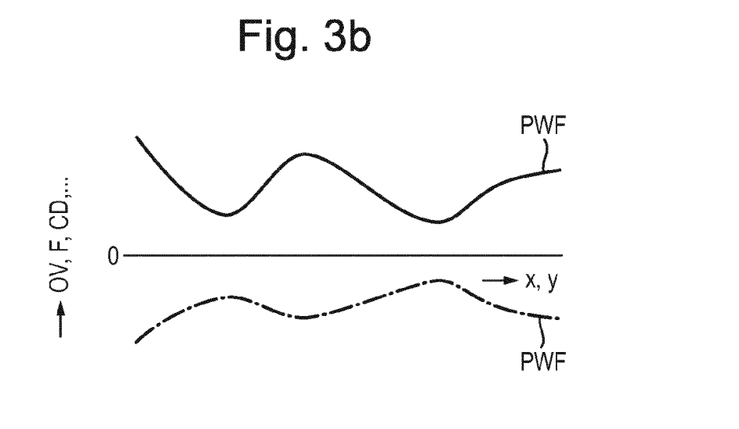

Based on computational or experimental methods the process window and/or margins for the performance parameters are determined, as depicted in FIGS. 3a and 3b. The margins are generally related to the yield of an IC manufacturing process; when the performance parameter exceeds the margins the yield may become unacceptably low. If the process windows are computationally derived, the following input is desirable: the reticle design RD—what features are present and where—and the critical state-parameters SP of the lithographic apparatus—e.g. measured lens aberrations, measured dose characteristics, measured focus control parameters. By measuring/calculating the process window across the substrate using a computational lithography system CL, a process window fingerprint PWF is derived.

It is also desirable to use, as input to the calculation of the process window and or margins, the results of measurements carried out on exposed substrates. For example, defectivity metrology measurements can be used it assist in identifying areas of the substrate where the process window is small.

Based on the determined uncertainty fingerprint and the determined process window fingerprint it is determined at which locations the performance parameter may become out of specification.

Figure 4:
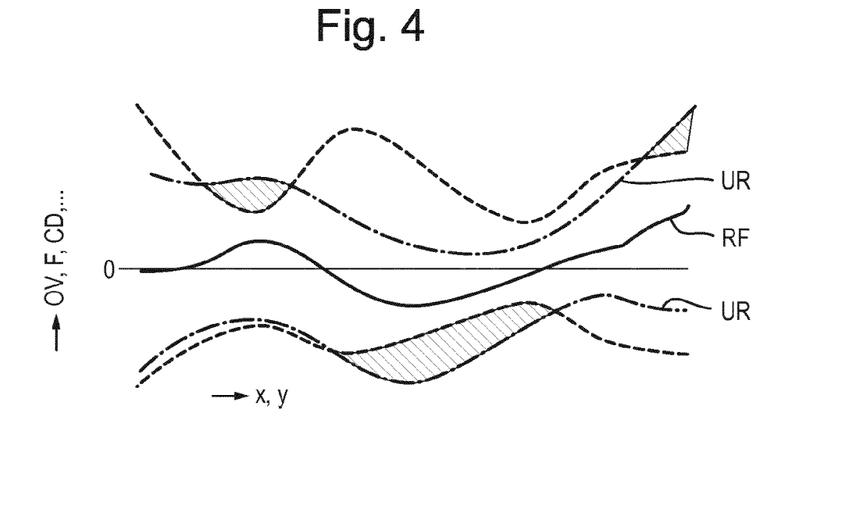
FIG. 4 is a graph showing residual fingerprint, uncertainty fingerprint and process window fingerprint.

The lithographic apparatus achieves control of the performance parameter by utilizing a plurality of correction devices, referred to as actuators. If there were no constraints on the actuation range and spatial characteristics of the correction profile (e.g. what range of profiles are correctable), the lithographic apparatus could be controlled in such a way that the uncertainty fingerprint is centered with respect to the process window fingerprint. In practice, the constraints related to the actuators (e.g. a limited spatial resolution) result in a residual fingerprint RF of the performance parameter, on top of which an uncertainty range UR is superimposed, as illustrated in FIG. 4. The residual fingerprint depends on what correction devices are used and the settings of the utilized correction devices. By careful selection and configuring of the correction devices a high accuracy control (low residual) may be achieved at a first area on the substrate at the cost of a lower accuracy control (higher residual) at a second area on the substrate. In FIG. 4 the residual fingerprint shows a "balanced" behavior, the accuracy of the control is not optimized for a specific area on the substrate, leading to a residual fingerprint that shows only a small variation across the substrate.

In one embodiment the process windows fingerprint, the residual fingerprint and the uncertainty fingerprint are superimposed enabling calculation of the probability that the related performance parameter(s) will be out of specification. In FIG. 4 the hatched areas indicate where on the substrate the probability is above a certain level. This calculated probability can be used to optimize actuator settings for maximum yield of the semiconductor manufacturing process. The actuators may be configured and selected such that a residual fingerprint associated with the actuators will minimize the area of the hatched areas as shown in FIG. 4; the probability of the performance parameter not meeting its specification is then effectively integrated across an area on the substrate (or the entire substrate). The integrated probability may be minimized by selecting and configuring the correction devices. In general also other metrics associated with the probability may be determined (for example the average, maximum or median across the substrate) and used to control the correction devices.

Figure 5:
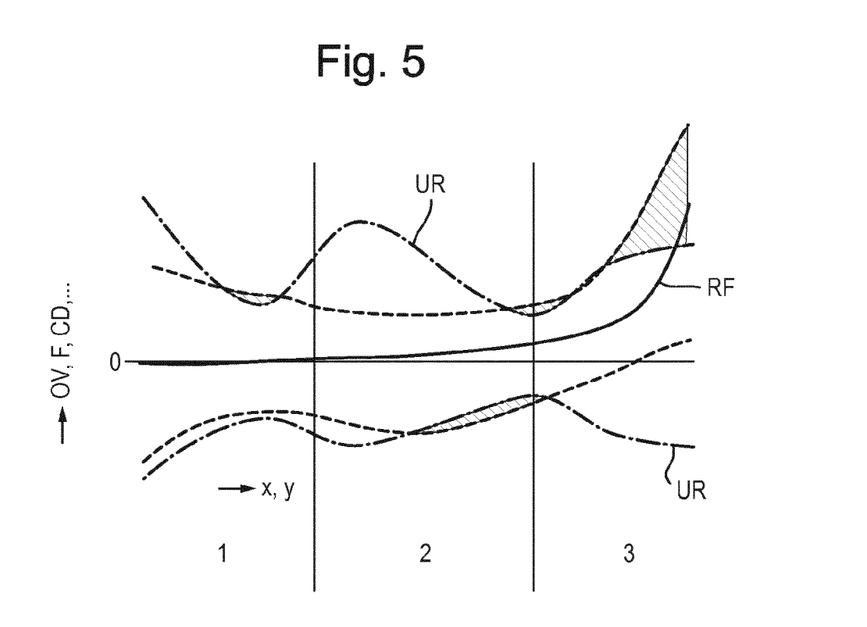
FIG. 5 is a graph showing residual fingerprint, uncertainty fingerprint and process window fingerprint after optimization according to an embodiment of the invention.

In another embodiment in addition to optimization of the probability for the full wafer/field area, we may include the layout of the dies within each field. FIG. 5 illustrates how the yield probability is optimized for a subset of the dies. This may be beneficial for cases where the yield probability of a particular subset of dies is very low, e.g. for dies on the edge of the substrate. In the example depicted in FIG. 5, die number 3 is "sacrificed" in order to improve the yield probability of dies 1 and 2, which are associated with an interior area of the substrate (e.g. remote from the edge of the substrate). It should be noted that ideally the die level optimization should address all performance parameters (dose, focus, overlay) and when needed across multiple layers. If one or more dies are sacrificed in one layer, then it may be desirable that if any sacrifices are necessary in other layers, the same dies should be sacrificed in those other layers.

It is noted that although typically correction devices (actuators) within a lithographic apparatus are used, also correction devices pertaining to processing apparatus like etch stations, tracks (resist development) and other processing equipment may be considered. This is especially relevant when the performance parameter is measured after etch (AEI=after etch inspection) and control of the etch station may significantly improve the CD or overlay parameter across the substrate.

In another embodiment a further optimization may be achieved by optimizing placement of the metrology targets (or optimize selection of the measurement locations associated with the metrology targets or other structures selected for measurement). A sampling scheme optimization can be based only on fingerprint uncertainty and uniformity however it is desirable to also take into account the process window fingerprint/hotspot locations. A hotspot location is a location identified as having a high risk of limiting the yield of the process due to its small process window. Taking the hotspot locations into account may reduce the uncertainty of the performance parameter on the hotspot locations, further improving the number of dies which meet specification.

In another embodiment the yield of the lithographic process is improved by adaptation of the performance parameter data utilized to control the lithographic process. As described before typically lithographic processes are controlled based on performance parameter data. Control is most critical at locations on the substrate where the process window is small; implying that relatively small excursions of the performance parameter may cause substantial yield loss at the locations of interest. An alternative to weighting of performance parameter values (with a number representative of the size of a process window at the particular locations on the substrate) is proposed. It is proposed to modify the performance parameter data before being utilized by the control infrastructure of the lithographic process. For example by amplifying the value of a performance parameter at a certain critical location the controller of the lithographic process may be forced to apply a larger correction to the critical location on the substrate, while, due to limitations of the control strategy, applying less than nominal corrections to locations on the substrate being less critical.

Figure 6A:
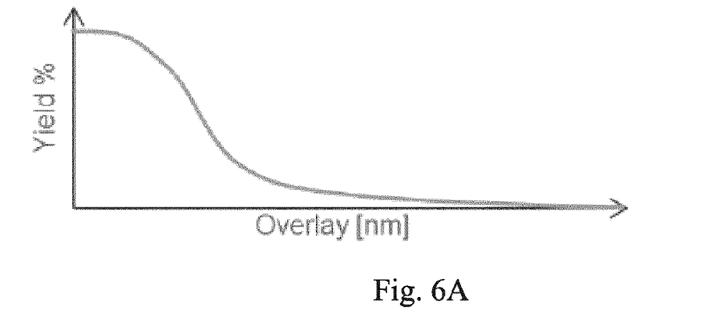
FIG. 6A depicts a yield-performance parameter characteristic associated with a critical location on a substrate.
Figure 6B:
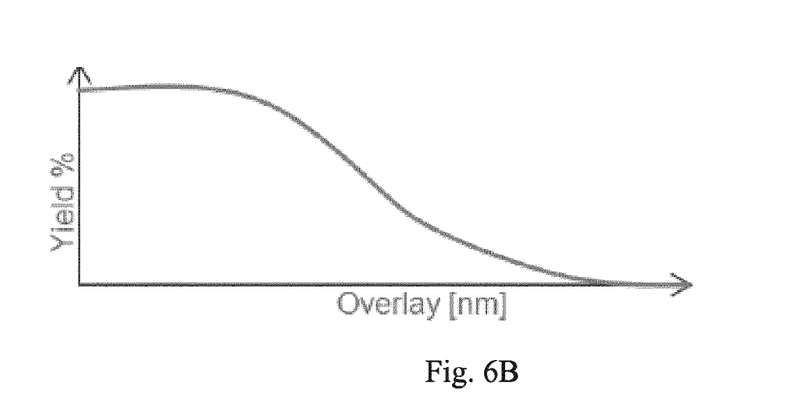
FIG. 6B depicts a yield-performance parameter characteristic associated with a less critical location on a substrate.

The process window in this embodiment is typically represented by a relation between a yield value and the performance parameter value. A process window associated with a critical location is depicted in graph 6A. The yield parameter steeply declines when the performance parameter (in this case overlay) increasingly deviates from its nominal value (here nominal value is 0). A process window associated with a less critical location on the substrate is depicted in FIG. 6B, the yield parameter initially does not change significantly when the overlay starts to increase. Only for large overlay excursions (large deviation of the overlay from its nominal value) the yield steeply declines.

Typically before modification of the performance data, the performance parameter data is normalized or referenced to a reference value. For example when the performance parameter data refers to a Critical Dimension (CD), the critical dimension data may be referenced to a nominal value of the critical dimension. For example when a nominal CD is 40 nm, a (measured) value of a CD may be referenced to its nominal value by subtracting 40 nm from the (measured) value of the CD and optionally divide the acquired value by 40 nm to get a normalized value. Analog to CD values also overlay, focus, dose or Edge Placement Errors (EPE) may be relevant as a performance parameter.

After the (optional) referencing and/or normalizing of the performance parameter data the performance parameter data is modified to provoke a controlled response to the modification which may have a beneficial effect on the yield of the lithographic process. Typically this is achieved by amplifying the performance parameter (e.g. scaling of the performance parameter values by a factor>1) associated with critical locations on the substrate. Alternatively, or in addition also damping of the performance parameter data associated with less critical locations (e.g. scaling of the performance parameter by a factor<1) can be implemented.

In response to the modification of the performance parameter data the control system of the lithographic process may correct the performance parameter for the critical locations to a larger extend than the performance parameter for the less critical locations. Effectively the critical locations are then optimized to a greater extend, while sacrificing some performance for the less critical locations on the substrate. Examples of control are: use of lens manipulators within a lithographic apparatus to control a performance parameter fingerprint across at least part of the substrate, use of wafer table actuators to modify positioning of the substrate during the lithographic process and/or use of adjusting thermal actuation of the substrate during an etching process of the substrate.

In an embodiment of the invention a method for improving the yield of a lithographic process is proposed, the method comprising: obtaining performance parameter data associated with at least part of a substrate, wherein the performance parameter data is utilized to control the lithographic process; determining a process window fingerprint of the performance parameter across the at least part of the substrate, the process window being associated with an allowable range of the performance parameter; and modifying the performance parameter data based on a predicted effect of the modifying the performance parameter data on the yield of the lithographic process.

The process window represents a relation between a value of the performance parameter and a value associated with the yield of a location or region on the substrate. Modifying the performance parameter comprises an amplification or damping of a value of the performance parameter. The value of the performance parameter may be referenced or normalized to a reference value before applying the amplification or damping of the performance parameter value. The control of the lithographic process typically comprises adjustment of an actuator associated with an apparatus utilized to perform the lithographic process. The actuator may control one of the following: a lens element, a stage movement, a temperature of an etch process, a direction of an etch process (for example a plasma etching direction). The performance parameter is typically one of the following: overlay, CD, EPE, focus, dose.

While specific embodiments of the invention have been described above, it will be appreciated that the invention may be practiced otherwise than as described.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments of the invention are disclosed in the list of numbered embodiments below:

1. A method for improving the yield of a lithographic process, the method comprising:
   determining a parameter fingerprint of a performance parameter across a substrate, the parameter fingerprint including information relating to uncertainty in the performance parameter;
   determining a process window fingerprint of the performance parameter across the substrate, the process window being associated with an allowable range of the performance parameter; and
   determining a probability metric associated with the probability of the performance parameter being outside an allowable range, using the parameter fingerprint and the process window fingerprint.

2. A method according to embodiment 1, further comprising determining a correction to the lithographic process based on the probability metric.

3. A method according to embodiment 2, wherein determining a correction comprises determining a correction to improve a residual parameter fingerprint resulting from application of the correction.

4. A method according to embodiment 3 wherein the correction is determined to minimise an average residual parameter fingerprint across the substrate.

5. A method according to embodiment 3 wherein the correction is determined to minimise the residual parameter fingerprint in a part of the substrate.

6. A method according to any one of embodiments 2 to 5, wherein the correction is applied by a correction device within a lithographic apparatus.

7. A method according to any one of embodiments 2 to 5, wherein the correction is applied by a correction device within a process station, such as an etch station, a deposition station or a polish station.

8. A method according to any one of embodiments 2 to 7, wherein the probability metric is calculated by integrating the probability across the entire substrate.

9. A method according to any one of embodiments 2 to 8, wherein the probability metric is calculated by integrating the probability across a subset of dies.

10. A method according to embodiment 9, wherein the subset of dies are fully exposed dies.

11. A method according to embodiment 9 or 10, wherein the subset of dies are dies exposed at an interior region on the substrate.

12. A method according to any one of embodiments 2 to 11, wherein the correction optimizes a number of dies for which the performance parameter lies within an allowable range.

13. A method according to any one of embodiments 2 to 9, wherein the correction optimises a cumulative probability of each die being formed correctly in one or more layers.

14. A method according to any preceding embodiment, wherein the performance parameter is one of: a focus parameter; a dose parameter; a CD parameter; an overlay parameter; a side-wall angle parameter; and an edge placement parameter.

15. A method for improving the yield of a lithographic process, the method comprising:
  determining an uncertainty fingerprint of a performance parameter across a substrate;
  determining a process window fingerprint of the performance parameter across the substrate, the process window being associated with an allowable range of the performance parameter;
  determining a probability metric associated with the probability of the performance parameter being outside an allowable range; and
  determining a position of a metrology target on the substrate based on the probability metric.

16. A method for improving the yield of a lithographic process, the method comprising:
  determining an uncertainty fingerprint of a performance parameter across a substrate;
  determining a process window fingerprint of the performance parameter across the substrate, the process window being associated with an allowable range of the performance parameter;
  determining a probability metric associated with the probability of the performance parameter being outside an allowable range; and
  determining a measurement position of a metrology target on the substrate based on the probability metric.

17. A method for improving the yield of a lithographic process, the method comprising:
  obtaining performance parameter data associated with at least part of a substrate, wherein the performance parameter data is utilized to control the lithographic process;
  determining a process window fingerprint of the performance parameter across the at least part of the substrate, the process window being associated with an allowable range of the performance parameter; and
  modifying the performance parameter data based on a predicted effect of the modifying on the yield of the lithographic process.

18. A method according to embodiment 17 further comprising controlling the lithographic process based on the modified performance parameter data.

19. A method according to embodiment 17 or 18, wherein the process window represents a relation between a value of a performance parameter and a value associated with the yield of a location or region on the substrate.

20. A method according to any of embodiments 17 to 19, wherein the modifying of the performance parameter data comprises subtracting a reference value and/or normalizing the performance parameter data.

21. A method according to any of embodiments 17 to 20, wherein the modifying of the performance parameter data comprises an amplification or damping of the performance parameter data.

22. A method according to any of embodiment 18, wherein the control of the lithographic process comprises adjustment of an actuator associated with an apparatus utilized to perform the lithographic process.

23. A method according to embodiment 22, wherein the actuator controls one of the following: a lens element, a stage movement, a temperature of an etch process, a direction of an etch process.

24. A method according to any of embodiments 17 to 23, wherein the performance parameter is one of the following: overlay, CD, EPE, focus, dose.

25. A device manufacturing method comprising performing the method of any one of the preceding embodiments to improve the yield of a lithographic process and performing the lithographic process to manufacture devices.

26. A computer program comprising computer-readable instructions that, when executed by a computer system, cause the computer system to perform a method according to any one of embodiments 1 to 24.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method for assessing performance parameter data characterizing a lithographic process, the method comprising:

obtaining a fingerprint, across a region on a substrate, of an uncertainty metric of a performance parameter comprised within the performance parameter data, the performance parameter selected from: critical dimension, overlay and/or edge placement error;

obtaining multiple process windows corresponding to multiple locations across the region, each process window representing a relation between the performance parameter and a yield of the lithographic process at its corresponding location;

using, by a hardware computer system, the fingerprint and multiple process windows to determine a probability of the performance parameter being outside an allowable range within the region; and configuring or controlling an aspect of a manufacturing or measurement process based on the determined probability and/or providing a signal representing, or based on, the determined probability to a tool or system for use by the tool or system in controlling or configuring an aspect of a manufacturing or measurement process.

2. The method of claim 1, wherein the performance data further comprises values of the performance parameter and the determining of the probability of the performance parameter being outside the allowable range further uses the values of the performance parameter.

3. The method of claim 2, wherein the values of the performance parameter correspond to multiple layers applied to the substrate.

4. The method of claim 1, wherein the uncertainty metric is proportional to a standard deviation of the performance parameter.

5. The method of claim 1, wherein the region comprises one or more dies on the substrate.

6. The method of claim 5, wherein the determining of the probability comprises integrating probability values across at least one die out of the one or more dies.

7. The method of claim 1, wherein the relation between the performance parameter and the yield is a graph expressing an expected yield as a function of a value of the performance parameter.

8. The method of claim 1, wherein the fingerprint and multiple process windows are further used to determine a critical location within the region where the probability of the performance parameter being outside an allowable range exceeds a specification value.

9. The method of claim 8, further comprising labeling the critical location as a hotspot location.

10. A method for assessing performance parameter data characterizing a lithographic process, the method comprising:

obtaining a fingerprint, across a region on a substrate, of an uncertainty metric of a performance parameter comprised within the performance parameter data, the performance parameter selected from: critical dimension, overlay and/or edge placement error;

obtaining multiple process windows corresponding to multiple locations across the region, each process window being associated with an allowable range of the performance parameter at its corresponding location;

using, by a hardware computer system, the fingerprint and multiple process windows to determine a probability of the performance parameter being outside an allowable range within the region; and configuring or controlling an aspect of a manufacturing or measurement process based on the determined probability and/or providing a signal representing, or based on, the determined probability to a tool or system for use by the tool or system in controlling or configuring an aspect of a manufacturing or measurement process.

11. A non-transitory computer-readable medium comprising instructions therein, the instructions, upon execution by a processor system, configured to cause the processor system to at least:

obtain performance parameter data relating to a lithographic process;

obtain a fingerprint, across a region on a substrate, of an uncertainty metric of a performance parameter comprised within the performance parameter data, the performance parameter selected from: critical dimension, overlay and/or edge placement error;

obtain multiple process windows corresponding to multiple locations across the region, each process window representing a relation between the performance parameter and a yield of the lithographic process at its corresponding location;

use the fingerprint and multiple process windows to determine a probability of the performance parameter being outside an allowable range within the region; and configure or control an aspect of a manufacturing or measurement process based on the determined probability and/or provide a signal representing, or based on, the determined probability to a tool or system for use by the tool or system in controlling or configuring an aspect of a manufacturing or measurement process.

12. The non-transitory computer-readable medium of claim 11, wherein the performance parameter data further comprises values of the performance parameter and the instructions are further configured to cause the processor system to determine the probability of the performance parameter being outside the allowable range based on the values of the performance parameter.

13. The non-transitory computer-readable medium of claim 12, wherein the values of the performance parameter correspond to multiple layers applied to the substrate.

14. The non-transitory computer-readable medium of claim 11, wherein the uncertainty metric is proportional to a standard deviation of the performance parameter.

15. The non-transitory computer-readable medium of claim 11, wherein the region comprises one or more dies on the substrate.

16. The non-transitory computer-readable medium of claim 15, wherein the instructions are further configured to cause the processor system to integrate probability values across at least one die out of the one or more dies.

17. The non-transitory computer-readable medium of claim 11, wherein the relation between the performance parameter and the yield is a graph expressing an expected yield as a function of a value of the performance parameter.

18. The non-transitory computer-readable medium of claim 11, wherein the instructions are further configured to cause the processor system to use the fingerprint and multiple process windows to determine a critical location within the region where the probability of the performance parameter being outside an allowable range exceeds a specification value.

19. The non-transitory computer-readable medium of claim 18, wherein the instructions are further configured to cause the processor system to label the critical location as a hotspot location.

20. A non-transitory computer-readable medium comprising instructions therein, the instructions, upon execution by a processor system, configured to cause the processor system to at least:

obtain performance parameter data relating to a lithographic process;

obtain a fingerprint, across a region on a substrate, of an uncertainty metric of a performance parameter comprised within the performance parameter data, the performance parameter selected from: critical dimension, overlay and/or edge placement error;

obtain multiple process windows corresponding to multiple locations across the region, each process window being associated with an allowable range of the performance parameter at its corresponding location;

use the fingerprint and multiple process windows to determine the probability of the performance parameter being outside an allowable range within the region; and configure or control an aspect of a manufacturing or measurement process based on the determined probability and/or provide a signal representing, or based on, the determined probability to a tool or system for use by the tool or system in controlling or configuring an aspect of a manufacturing or measurement process.

* * * * *

UNITED STATES PATENT AND TRADEMARK OFFICE
CERTIFICATE OF CORRECTION

| | |
|---|---|
| PATENT NO. | : 11,480,884 B2 |
| APPLICATION NO. | : 16/936867 |
| DATED | : October 25, 2022 |
| INVENTOR(S) | : Everhardus Cornelis Mos et al. |

It is certified that error appears in the above-identified patent and that said Letters Patent is hereby corrected as shown below:

On the Title Page

Item (63) Related U.S. Application Data
Please correct "Continuation of application No. 16/431,168" to "Continuation of application No. 16/343,168"

Signed and Sealed this
Thirteenth Day of August, 2024

Katherine Kelly Vidal
*Director of the United States Patent and Trademark Office*